US007196576B2

(12) United States Patent
Mizuta et al.

(10) Patent No.: US 7,196,576 B2
(45) Date of Patent: Mar. 27, 2007

(54) METHOD AND APPARATUS FOR CONTROL OF PREDISTORTION LINEARIZER BASED ON POWER SERIES

(75) Inventors: Shinji Mizuta, Yokohama (JP); Yasunori Suzuki, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 150 days.

(21) Appl. No.: 11/065,274

(22) Filed: Feb. 25, 2005

(65) Prior Publication Data

US 2005/0189990 A1 Sep. 1, 2005

(30) Foreign Application Priority Data

Feb. 27, 2004 (JP) .............................. 2004-053244

(51) Int. Cl.
*H03F 3/66* (2006.01)
*H03F 1/00* (2006.01)
(52) U.S. Cl. ........................................ 330/52; 330/151
(58) Field of Classification Search .................... None
See application file for complete search history.

(56) References Cited

U.S. PATENT DOCUMENTS

| 5,565,814 | A * | 10/1996 | Fukuchi ........................ 330/52 |
| 6,515,544 | B1 * | 2/2003 | Suzuki et al. ................ 330/151 |
| 6,549,067 | B1 | 4/2003 | Kenington |
| 6,580,320 | B1 | 6/2003 | Kenington et al. |
| 6,727,751 | B2 * | 4/2004 | Yonenaga et al. ........... 330/151 |
| 6,801,083 | B2 * | 10/2004 | Ishigami et al. ............... 330/52 |
| 6,940,346 | B2 * | 9/2005 | Miyaji et al. .................. 330/52 |

FOREIGN PATENT DOCUMENTS

| JP | 2002-57533 | 2/2002 |
| JP | 2002-64340 | 2/2002 |
| JP | 2003-229727 | 8/2003 |

OTHER PUBLICATIONS

U.S. Appl. No. 11/444,494, filed Jun. 1, 2006, Suzuki et al.
U.S. Appl. No. 11/446,381, filed Jun. 5, 2006, Suzuki et al.

(Continued)

*Primary Examiner*—Robert Pascal
*Assistant Examiner*—Krista Flanagan
(74) *Attorney, Agent, or Firm*—Oblon, Spivak, McClelland, Maier & Neustadt, P.C.

(57) ABSTRACT

A gain adjuster and a phase adjuster of a distortion generation path are set so that an extracted distortion component becomes small, the extracted component is compared with a reference value. When an upper-frequency distortion component of a pilot signal is larger than the reference value, the gain and phase of a frequency characteristic compensator of the distortion generation path are controlled so that the upper-frequency distortion component of the pilot signal becomes smaller than a value preset in the controller. When a lower-frequency distortion component of the pilot signal is larger than a reference value, the gain and phase of the frequency characteristic compensator of the distortion generation path are controlled so that the lower-frequency distortion component of the pilot signal becomes smaller than a value preset in the controller.

19 Claims, 10 Drawing Sheets

OTHER PUBLICATIONS

Wolfgang Boesch, et al., "Measurement and Simulation of Memory Effects in Predistortion Linearizers", IEEE Transactions on Microwave Theory and Techniques, vol. 37, No. 12, Dec. 1989, pp. 1885-1890.

Toshio Nojima, et al., "Analysis and Compensation of TWT Nonlinearities Based on Complex Power Series Representation", vol. J164-B, No. 12, Dec. 1981, pp. 1449-1456.

* cited by examiner

FIG. 1

FIG. 2A  PILOT SIGNAL (BASE BAND)

FIG. 2B  POWER AMPLIFIER OUTPUT SIGNAL

FIG. 2C  DIGITAL LINEARIZER OUTPUT SIGNAL (BASE BAND)

FIG. 2D  POWER AMPLIFIER OUTPUT SIGNAL

METHOD AND APPARATUS FOR CONTROL OF PREDISTORTION LINEARIZER BASED ON POWER SERIES

TECHNICAL FIELD

The present invention relates to linearization of a power amplifier for use in radio communication transmitters.

BACKGROUND ART

One of known methods of nonlinear compensation for a power amplifier is a predistortion method. The predistortion method adds a distortion component in advance to the input signal so as to cancel the distortion component that occurs in a power amplifier. In this specification the distortion component that is added by the predistortion method will hereinafter be referred to as a compensation signal. An ideal compensation signal is set to be equal in level to but 180° out of phase with the distortion component that is actually created by the power amplifier. The amount of compensation for distortion by the predistortion method depends on accuracies of the amplitude and phase of the compensation signal. For example, when the input-output characteristics of the power amplifier are formulated by a power series model, a compensation signal keeps amplitude and phase deviations of each odd-order distortion component within ±0.28 dB and ±1.8°, respectively for the attainment of a 30 dB compensation.

Generally speaking, as the operating point of the power amplifier approaches saturation power, the power added efficiency (hereinafter referred to as efficiency) increases. However, operation of the power amplifier around the saturation power region causes an increase in the distortion component. To attain a desired amount of attenuation of distortion outside a signal band (an adjacent-channel leakage power ratio or the like), higher distortion compensation is required than in the case of operating the power amplifier in a low-efficiency region.

However, the nonlinear characteristic of the power amplifier in the around the saturation power is so complex that it is not easy to generate a compensation signal which provides the above-mentioned amplitude and phase deviations for each odd-order distortion component. One of the factors for complicating the nonlinear characteristic is so-called memory effects in the nonlinear characteristic itself (for example, W. Bosch and G. Gatti, "Measurement and Simulation of Memory Effects in Predistortion Linearizer," IEEE Trans. Microwave Theory Tech., Vol. 37, pp. 1885–1890, December 1989, hereinafter referred to as non-patent document 1). Such memory effects leads to convolution of the distortion component by a band pass filter with certain characteristics, thereby adding a frequency characteristic to the distortion component that occurs in the power amplifier. On this account, to attain predetermined distortion compensation over a certain frequency band, the compensation signal needs to be set so that the amplitude and phase of each odd-order distortion component stay within predetermined deviations throughout the frequency band. Another factor for complication of the nonlinear characteristic is the generation of not only 3rd-order but also 5th- or higher-order distortion components at the output of the power amplifier. To achieve high distortion compensation, the compensation signal is required to have such frequency characteristics as compensate for the frequency characteristics attributable to the memory effect, and a higher-order compensation signal needs to be generated.

With a conventional predistortion linearizer based on power series, hereinafter referred to as a power series predistortion linearizer, (for example, Japanese Patent Application Kokai Publication 2003-229727, hereinafter referred to as patent document 1, and Nojima and Okamoto, "Analysis and Compensation of TWT Nonlinearities Based on Complex Power Series Representation," Journal of IEICE (B), Vol. J64-B, No. 12, pp. 1449–1456, hereinafter referred to as non-patent document 2), the input signal is exponentiated and adjusted its amplitude and phase to generate a compensation signal. However, no desired frequency characteristics can be imparted to the compensation signal, and for this reason it is impossible to achieve high distortion compensation.

Predistortion methods of compensation for frequency characteristics are proposed, for instance, in Japanese Patent Application Kokai Publication 2002-64340, hereinafter referred to as patent document 2, and Japanese Patent Application Kokai Publication 2002-57533, hereinafter referred to as patent document 3. In particular, in patent document 2 the output from the distortion generator is divided into high- and low-frequency components of the fundamental signal, and the both frequency components are adjusted in amplitude and in phase independently of each other to provide the compensation signal with frequency characteristics. In patent document 3 amplitude-frequency characteristics adjusting circuit composed of a band pass filter and a vector adjuster is disposed behind a distortion generator to add frequency characteristics to the compensation signal.

However, patent documents 2 and 3 do not clearly disclose how to obtain the desired frequency characteristics for the compensation signal. Further, these patent documents are suggestive of the configuration for compensating for 3rd- and higher-order distortion components, but they are silent about a concrete method of compensating for the higher-order distortion components. The compensation for high-order distortions presents such a problem as mentioned below.

When a certain order compensation signal is added by the predistortion linearizer, the added compensation signal leads to generation of a new distortion component at the output of the power amplifier. The newly developed distortion component affects the compensation effects on distortion components of other orders. As a result, there is possibility that the compensation for distortions of the other orders does not become optimum. Hence, it is necessary to take into account such interdependence between the compensation effects on the distortion components of different orders.

SUMMARY OF THE INVENTION

It is therefore an object of the present invention to provide a concrete method and apparatus for controlling the power series predistortion linearizer that implement the frequency characteristics of the compensation signal. Another object of the invention is to provide a method and apparatus for controlling a power series predistortion linearizer that permit compensation for high-order distortion components as required.

The power series predistortion linearizer control method is a method for a power series predistortion linearizer wherein an input signal is divided and provided to a linear signal transfer path and N odd-order distortion generation paths, N being an integer equal to or greater than 1, and the outputs from said odd-order distortion generation paths are combined into a distortion compensation signal for compensating an intermodulation distortion by a power amplifier, and said odd-order distortion generation paths each have inserted therein a distortion generator for generating an odd-order distortion of said input signal and a frequency characteristic compensator for providing said odd-order distortion with desired frequency characteristics. The power series predistortion linearizer control method comprises the steps of:

(a) inputting a pilot signal and said input signal to said power series predistortion linearizer;

(b) extracting distortion components of said pilot signal from the output from said power amplifier;

(c) comparing the upper-frequency one of said extracted distortion components of said pilot signal with a reference value, and adjusting frequency characteristics of the gain and phase of said frequency characteristic compensator so that said upper-frequency distortion component of said pilot signal becomes smaller than said reference value; and (d) comparing the lower-frequency one of said extracted distortion components of said pilot signal with a reference value, and adjusting frequency characteristics of the gain and phase of said frequency characteristic compensator so that said lower-frequency distortion component of said pilot signal becomes smaller than said reference value.

The control apparatus for implementing the method of controlling the above-mentioned power series predistortion linearizer according to the present invention comprises:

a pilot signal generator for generating upper- and lower-frequency pilot signals and for inputting said upper- and lower-frequency pilot signals to said power series predistortion linearizer;

a distortion extractor for extracting odd-order distortion components of said upper- and lower-frequency pilot signals from the output from said power amplifier; and a controller for controlling the frequency characteristics of the gain and phase of said frequency characteristic compensator so that said odd-order distortion components of said upper- and lower-frequency pilot signals become smaller than reference values.

DETAILED DESCRIPTION OF THE PREFERRED EMBODIMENT

Embodiment 1

Figure 1:
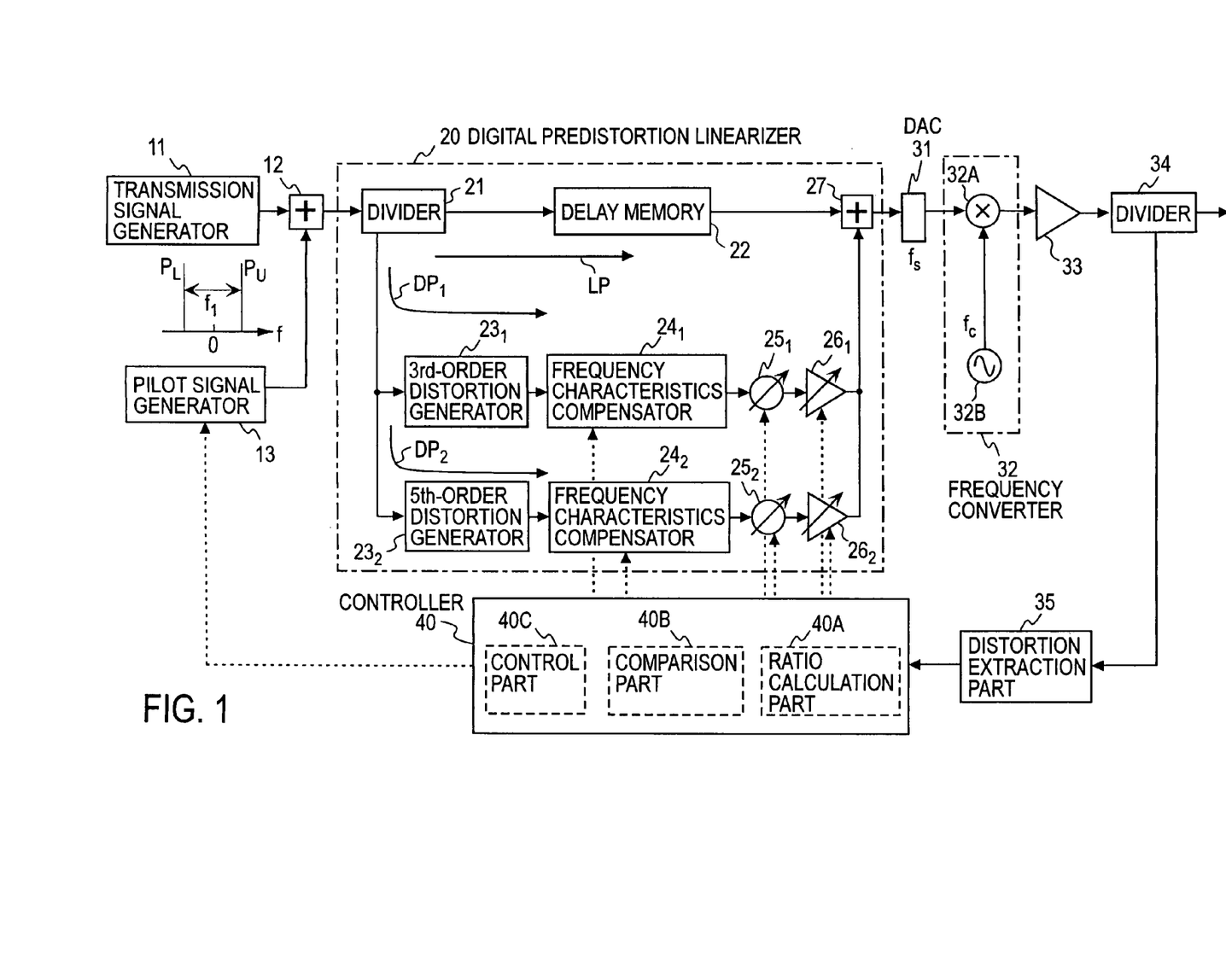
FIG. 1 is a block diagram illustrating the configuration for a power series predistortion linearizer with a control means according to a first embodiment of the present invention.

FIG. 1 illustrates in block form a basic configuration of the power series predistortion linearizer with a control means embodying the present invention. The illustrated power series predistortion linearizer is intended for compensating for 3rd- and 5th-order distortions. A transmission signal from a transmission signal generator 11 is supplied via an adder 12 to a digital predistortion linearizer 20. The predistortion linearizer 20 divides and distributes the input signal by a divider 21 to a linear signal transfer path LP including a delay memory 22, a 3rd-order distortion generation path $DP_1$, and a 5th-order distortion generation path $DP_2$, and adds the outputs from these paths LP, $DP_1$, and $DP_2$ by an adder 27 to provide the output from the predistortion linearizer 20. In the 3rd-order distortion generation path $DP_1$, there are connected in series a 3rd-order distortion generator $23_1$, a frequency characteristic compensator $24_1$, a phase adjuster $25_1$, and a gain adjuster $26_1$. Similarly, in the 5th-order distortion generation path $DP_2$ there are connected in series a 5th-order distortion generator $23_2$, a frequency characteristic compensator $24_2$, a phase adjuster $25_2$, and a gain adjuster $26_2$. The odd-order distortion generators $23_1$ and $23_2$ each perform an odd-order operation for the input signal thereto. For example, letting the input signal be represented by x, the 3rd-order distortion generator $24_1$ performs an $x^3$ operation. The present invention is applicable, in general, to a digital predistortion linearizer provided with a desired number N (N being an integer equal to or greater than 1) of odd-order distortion generation paths.

The output from the digital predistortion linearizer 20 is converted by a digital-to-analog converter (DAC) 31 to an analog signal, which is converted, by a frequency converter 32 composed of a mixer 32A and a local oscillator 32B, to a signal of the radio frequency band, which is then applied to a power amplifier 33 that is an object of distortion compensation.

There are further provided a pilot signal generator 13, an adder 12, a divider 34, a distortion extractor 35, and a controller 40, which constitute a control apparatus for the predistortion linearizer according to the present invention. The pilot signal generator 13 generates, as pilot signals $P_U$ and $P_L$ in the base band, two carriers of frequencies $f_1/2$ and $-f_1/2$ and equal in amplitude, and provides the pilot signals $P_U$ and $P_L$ via the adder 12 to the digital predistortion linearizer 20. One portion of the output from the power amplifier 33 is extracted by the divider 34 and provided to the distortion extractor 35. The distortion extractor 35 extracts 3rd- and 5th-order distortions created by the power amplifier 33 due to intermodulation of two pilot signals $P_U$ and $P_L$, and provides the distortions to the controller 40. The controller 40 controls the frequency characteristic compensators $24_1$, $24_2$, the phase adjusters $25_1$, $25_2$, and the gain adjusters $26_1$, $26_2$ so that the extracted intermodulation distortion components are lower than predetermined adjacent-channel leakage power ratios. The use of the pilot signals facilitates the extraction of odd-order distortion components modeled by the power series, allowing ease in controlling the frequency characteristic compensators, the gain adjusters and the phase adjusters of the power series predistortion linearizer.

As indicated by the broken lines, the controller 40 is made up of: a ratio calculation part 40A for calculating adjacent-channel leakage power ratios using the distortion components of respective orders extracted by the distortion extractor 35; a comparison part 40B for comparing the calculated adjacent-channel leakage power ratios with reference values; and a control part 40C for controlling the frequency characteristic compensators, the phase adjusters and the gain adjusters of the distortion generation paths of the respective orders on the basis of the comparison results. The adjacent-channel leakage power ratio in the case of using the pilot signal is expressed by the power ratio of each distortion component to the pilot signal in the power amplifier output. Assuming that the pilot signal power is fixed, since the adjacent-channel leakage power ratio of each distortion component corresponds to the power ratio of that distortion component, the power to the pilot signal need not be computed, but instead the power value of each distortion component is compared with a predetermined reference value, and the above-mentioned control is effected so that the power value of the distortion component becomes smaller than the reference value. In this instance, the ratio calculation part 40A is unnecessary.

Figure 2A:
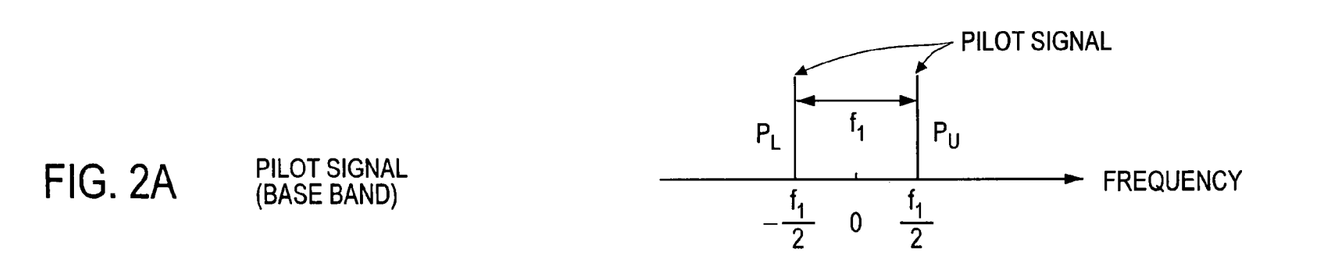
FIG. 2A is a diagram schematically showing the spectra of pilot signals in a base-band representation.
Figure 2B:
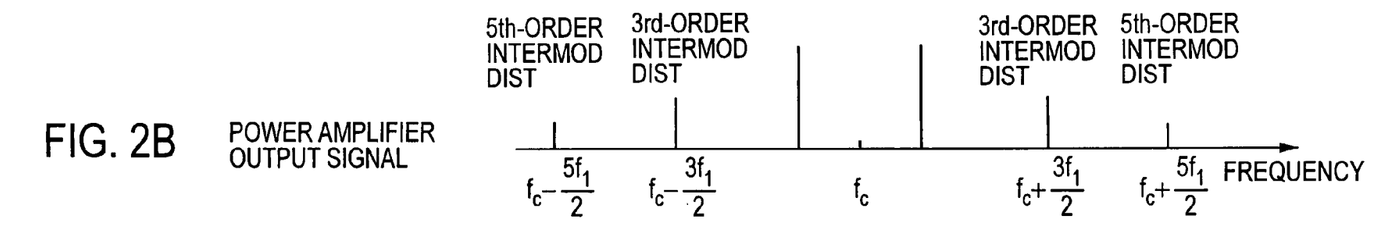
FIG. 2B is a diagram schematically showing the spectra of intermodulation distortion components in the power amplifier output.

For the purpose of explaining the operation of the predistortion linearizer equipped with the frequency characteristic compensators, spectra of signals at respective parts of the predistortion linearizer are schematically shown in FIGS. 2A to 2D. The pilot signals $P_U$ and $P_L$ are generated in the base band which are two carriers spaced a frequency $f_1$ apart but equal in amplitude (FIG. 2A). The pilot signals $P_U$ and $P_L$ are expressed as base band signals in FIG. 2A. The pilot signals $P_U$ and $P_L$ are up converted by the frequency converter 32 to a center frequency $f_c$, and the frequency-converted signals are applied to the power amplifier 33, wherein intermodulation distortions occur in the output from the power amplifier 33 (FIG. 2B). The intermodulation distortion components shown in FIG. 2B are 3rd-order distortion components of upper and lower frequencies ($f_c+3f_1/2$ and $f_c-3f_1/2$) with respect to the center frequency $f_c$ and 5th-order distortion components of upper and lower frequencies ($f_c+5f_1/2$ and $f_c-5f_1/2$) outside the 3rd-order distortion components. To cancel these intermodulation distortion components, the predistortion linearizer 20 adds compensation signals to the pilot signals.

Figures 2C, 2D:
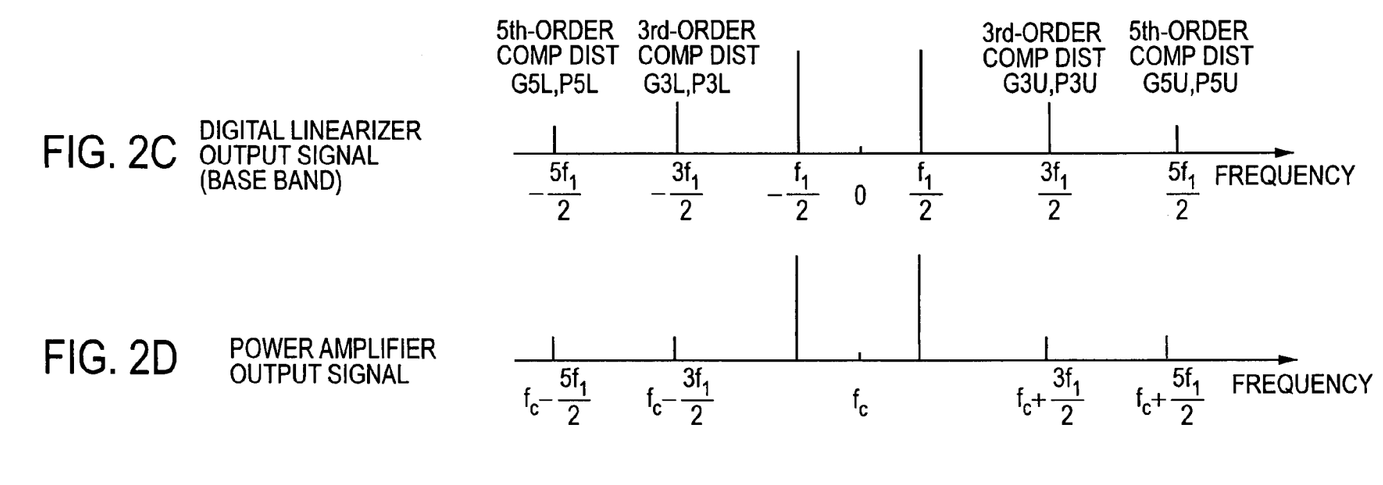
FIG. 2C is a diagram schematically showing the spectra of distortion-compensated signals in the digital predistortion linearizer output in the base-band representation.
FIG. 2D is a diagram schematically showing the spectrum of a distortion-compensated power amplifier output.

In FIG. 2C there are expressed as base band signals an upper 3rd-order compensating distortion (gain G3U and phase P3U), a lower 3rd-order compensating distortion (gain G3L and phase P3L), an upper 5th-order compensating distortion (gain G5U and phase P3U) and a lower 5th-order compensating distortion (gain G5L and phase P5L) in the output from DAC 31. In FIG. 2C, however, there are not shown variations in phase and gain by the phase adjusters $25_1$, $25_2$ and the gain adjuster $26_1$, $26_2$. The output signals from DAC 31 are up converted by the frequency converter 32, and input to the power amplifier 33. The output signals from the power amplifier 33 are signals compensated by the digital predistortion linearizer 20 (FIG. 2D). The gain adjusters $25_1$, $25_2$, the phase adjusters $26_1$, $26_2$, and the frequency characteristic compensators $24_1$, $24_2$ are so controlled as to cancel the intermodulation distortions created in the power amplifier output. Incidentally, it is supposed that the gain adjusters $26_1$ and $26_2$ are to provide a fixed gain in frequency and that the phase adjusters $25_1$ and $25_2$ are to provide a fixed phase variation in frequency.

Figure 3:
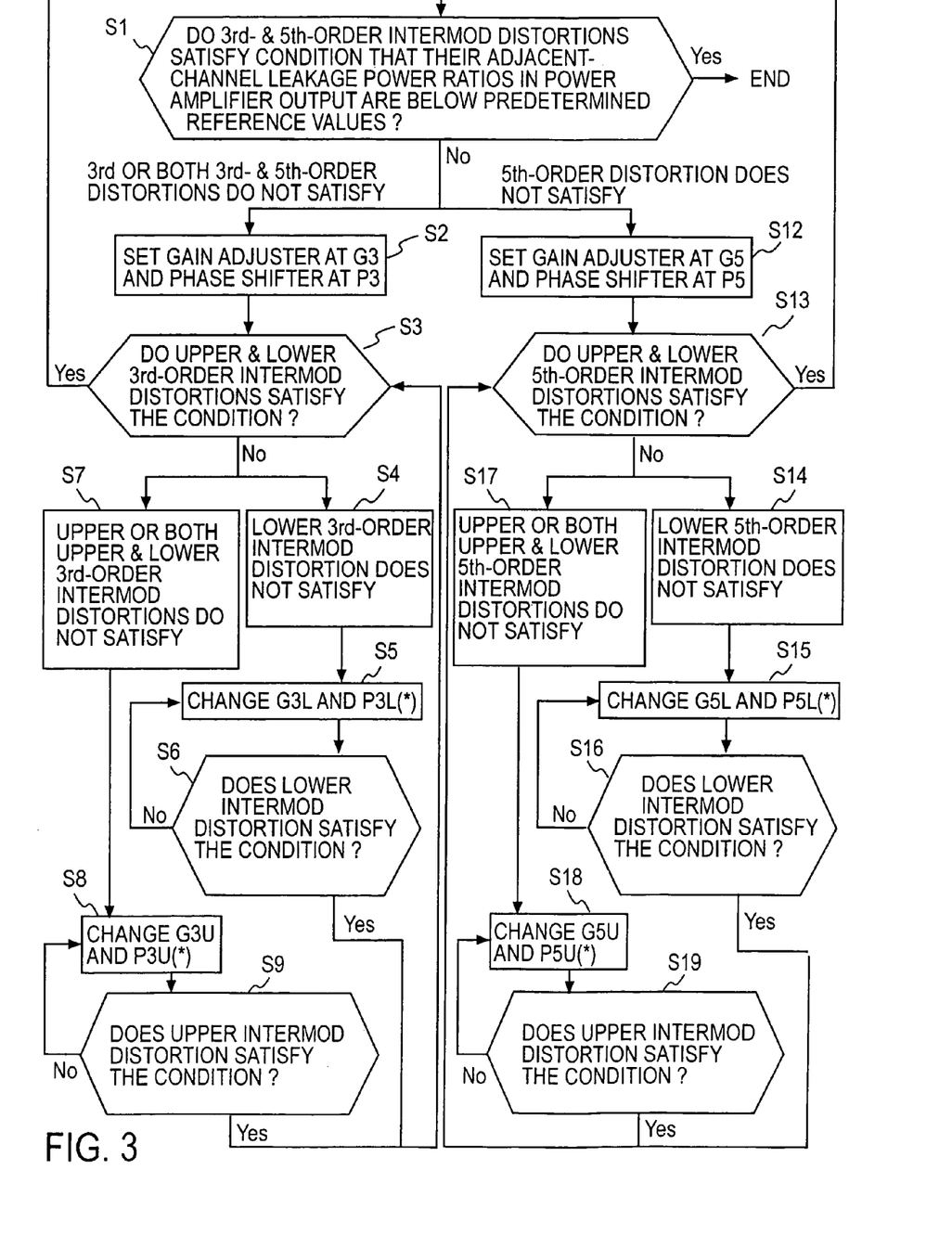
FIG. 3 is a flowchart of a method for obtaining characteristics of a frequency characteristic compensator.

Turning next to FIG. 3, a description will be given of how to obtain characteristics of the frequency characteristic compensator. Since the compensation for a distortion of a certain order exerts an influence on the compensation for a distortion of the other order, the compensation for distortions of multiple orders needs to be repeated sequentially until the distortions satisfy the condition that adjacent-channel leakage power ratios are lower than predetermined values. In such an instance, it is presumed that the influence of the compensation for the lower-order distortion on the compensation for the higher-order distortion is greater than the influence of the latter on the former; therefore, the compensation for the 3rd-order distortion is followed by the compensation for the 5th-order distortion with a view to reducing the workload of repeated distortion compensation until the above-mentioned conditions are satisfied.

In the first place, 3rd- and 5th-order intermodulation distortion components are extracted by the distortion extractor 35 from the output signal from the power amplifier 33, then adjacent-channel leakage power ratios for the respective distortion components are calculated in the ratio calculation part 40A of the controller 40, and the ratios are compared with predetermined reference values in the comparison part 40B to make a check to see if the upper and lower intermodulation distortions of the 3rd and 5th orders both satisfy the conditions that their adjacent-channel leakage power ratios are below the reference values (step S1).

When the 3rd-order distortion or both the 3rd- and 5th-order distortions do not satisfy the condition, the gain G3 of the gain adjuster $26_1$ and the phase P3 of the phase adjuster $25_1$ are set to compensate first for the 3rd-order distortion (step S2). These values may be set arbitrarily, but they may preferably be set so that the adjacent-channel leakage power ratio becomes relatively low. After this, a check is made again to determine if the upper and lower 3rd-order intermodulation distortion components each meet the above-mentioned condition on the adjacent-channel leakage power ratio (step S3). When the lower distortion component does not meet the condition (step S4), the gain G3L and phase P3L of the frequency characteristic compensator $24_1$ at the frequency $f_c-3f_1/2$ are changed (step S5) to satisfy the condition (step S6). When the upper or both upper and lower 3rd-order distortion components do not satisfy the condition (step S7), the gain G3U and phase P3U of the frequency characteristic compensator $24_1$ at the frequency $f_c+3f_1/2$ are changed (step S8) to meet the condition (step S9).

In the case where neither of the upper and lower distortion components satisfies the condition, the gain and phase of the frequency characteristic compensator corresponding to either one of the upper and lower distortion components are changed to meet the condition (FIG. 3 shows the case of changing the gain G3U and phase P3U for the upper distortion component at step S8). This operation is repeated until either of the upper and lower intermodulation distortions satisfy the condition. Here, the gains G3U and G3L of the frequency characteristic compensator $24_1$ represent differences from the gain G3 of the gain adjuster $26_1$ and that the phases P3U and P3L represent differences from the phase change P3 of the phase adjuster $25_1$.

When the 5th-order intermodulation distortion does not satisfy the condition that its adjacent-channel leakage power ratio is below a predetermined reference value, the gain of the gain adjuster $26_2$ and the phase of the phase adjuster $25_2$ are set at G5 and P5, respectively (S12). These values may be set arbitrarily, but they may preferably be set so that the adjacent-channel leakage power ratio becomes relatively low. Then, a check is made to determine if the upper and lower 5th-order inter-modulation distortion components each meet the predetermined condition on the adjacent-channel leakage power ratio (step S13). When the lower distortion component does not meet the condition (step S14), the gain G5L and phase P5L of the frequency characteristic compensator $24_1$ at the frequency $f_c-5f_1/2$ are changed (step S15) to satisfy the condition (step S16). When the upper or both upper and lower 5th-order distortion components do not satisfy the condition (step S17), the gain G5U and phase P5U of the frequency characteristic compensator $24_1$ at the frequency $f_c+5f_1/2$ are changed (step S18) to meet the condition (step S19).

In the case where neither of the upper and lower distortion components satisfies the condition, the gain and phase of the frequency characteristic compensator corresponding to either one of the upper and lower distortion components are changed to provide the predetermined adjacent-channel leakage power ratio (FIG. 3 shows the case of changing the gain G5U and phase P5U for the upper distortion component at step S18). This operation is repeated until either of the upper and lower intermodulation distortions satisfy the predetermined condition on the adjacent-channel leakage power ratio. Here, the gains G5U and G5L of the frequency characteristic compensator $24_2$ represent differences from the gain G5 of the gain adjuster $26_2$ and that the phases P5U and P5L represent differences from the phase change P5 of the phase adjuster $25_2$.

In the case where both the 3rd- and 5th-order intermodulation distortions do not satisfy the condition that the adjacent-channel leakage power ratio is lower than the predetermined reference value, either one of the 3rd- and 5th-order distortions is so adjusted as to meet the condition by the same method as described above. (FIG. 3 shows the case of adjusting the 3rd-order distortion at step S2.)

Figure 4:
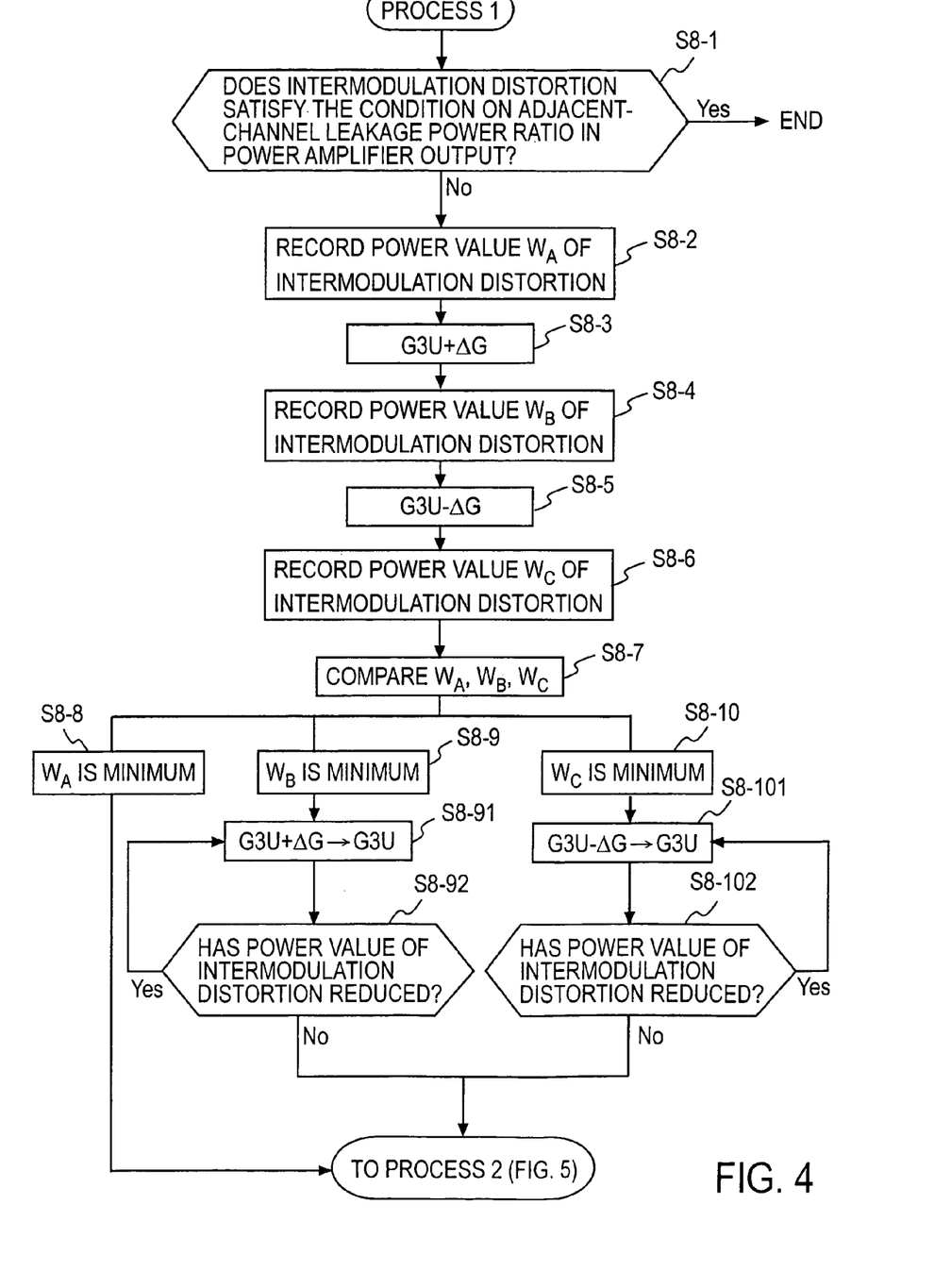
FIG. 4 is a flowchart showing process 1 for obtaining the characteristics of the frequency characteristic compensator.
Figure 5:
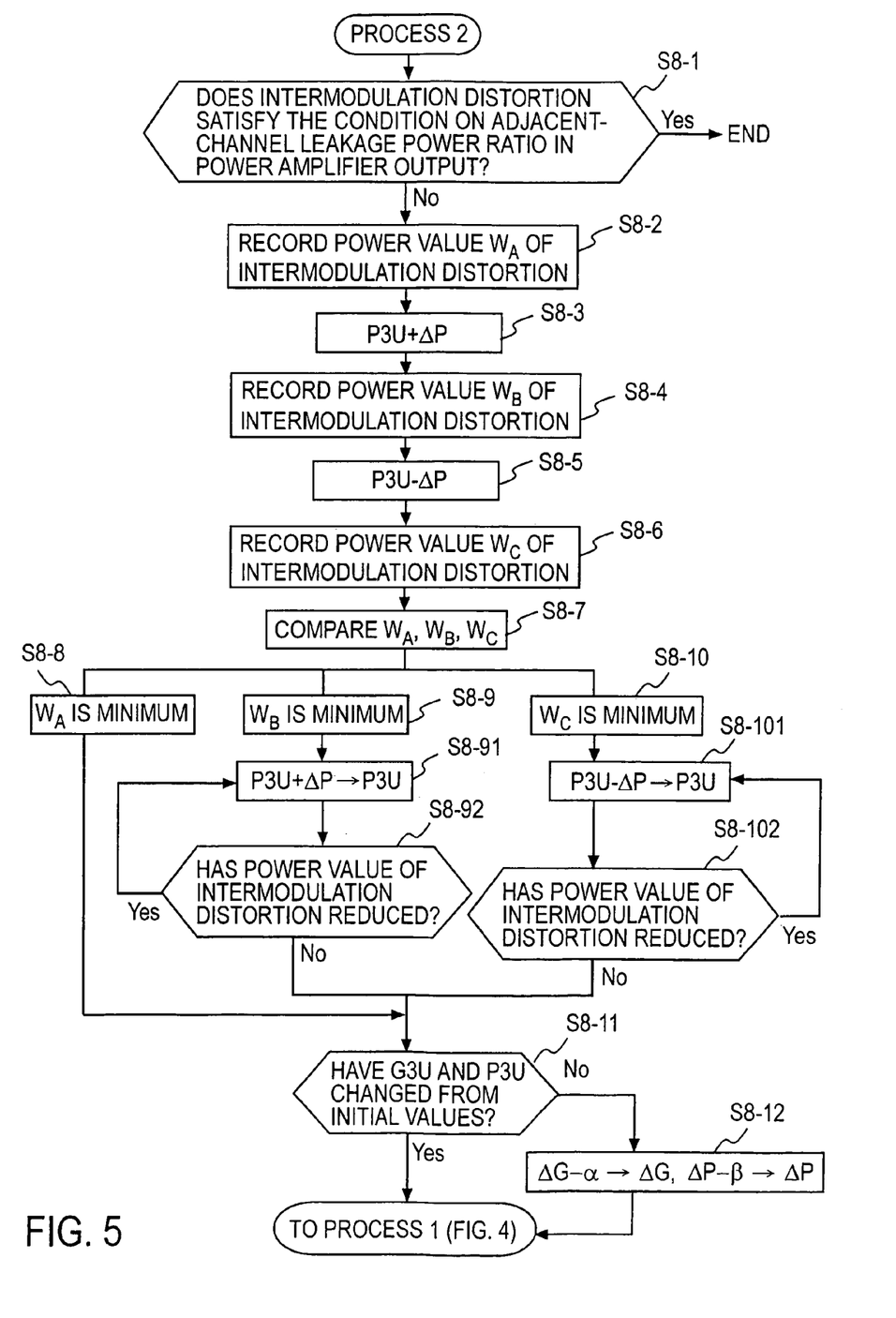
FIG. 5 is a flowchart showing process 2 for obtaining the characteristics of the frequency characteristic compensator.

FIGS. 4 and 5 shows in detail the steps (S5, S8, S15 and S18 indicated by the symbol "*" in FIG. 3) for obtaining gains and phases (G3L and P3L, G3U and P3U, G5L and P5L, and G5U and P5U) of the frequency characteristic compensators $24_1$ and $24_2$. By way of example, the adjustment of G3U and P3U (step 8 in FIG. 3) will be described below. The other steps are performed in the same way as in the case of step S8.

In the first place, a check is made to see if the intermodulation distortion satisfies the condition that the adjacent-channel leakage power ration is lower than a predetermined value (step S8-1). In the condition is met, then the process ends. If the condition is not met, then the power value $W_A$ of the intermodulation distortion is recorded which occurs at the frequency $f_c+3f_1/2$ at that time (step S8-2). Then the gain G3U is added with a certain step width $\Delta G$ (step S8-3), and the power value $W_B$ of the intermodulation distortion is recorded which occurs at the frequency $f_c+3f_1/2$ at that time (step S8-4). Then the step width $\Delta G$ is subtracted from the gain G3U (step S8-5), and the power value $W_C$ of the intermodulation distortion is recorded which occurs at the frequency $f_c+3f_1/2$ at that time (step S8-6). The step width may be set at an arbitrary value.

The power values $W_A$, $W_B$ and $W_C$ thus recorded are compared (step S8-7), and if the power value $W_A$ is the smallest among them, then the procedure shifts to the process for the phase P3U (step S8-8). When the power value $W_B$ or $W_C$ is the smallest (step S8-9, S8-10), the addition or subtraction (step S8-91, S8-101) is repeated until the intermodulation distortion occurring at the frequency $f_c+3f_1/2$ does not decrease (step S8-92, S8-102). When the intermodulation distortion no longer decreases, the procedure shifts to the process for the phase P3U (process 2 depicted in FIG. 5). The processing for the phase P3U is also performed by the same procedure for the gain G3U.

Eventually, when the intermodulation distortion occurring at the frequency $f_c+3f_1/2$ does not decrease any longer, a check is made to see if G3U and P3U have changed from their initial values (step S8-11). If they have changed, the procedure shifts to re-adjustment of the gain G3U by process 1 shown in FIG. 4. If they have not changed, the step widths $\Delta G$ and $\Delta P$ are reduced by $\alpha$ and $\beta$ (positive constants), respectively (step S8-12), after which process 1 in FIG. 4 is performed again. While in FIGS. 4 and 5 the adjustment starts with G3U, it may start with P3U.

Figure 6A:
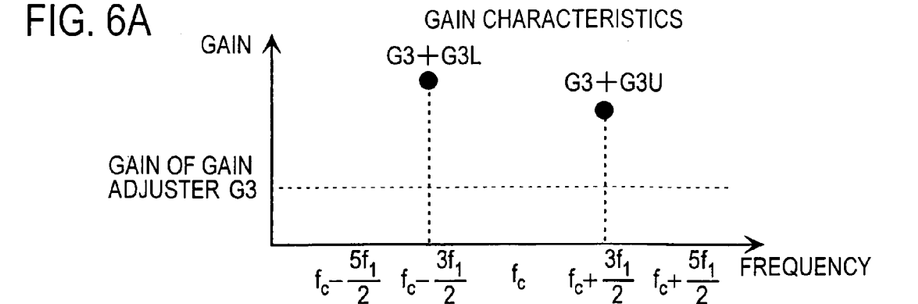
FIG. 6A illustrates a general idea of the frequency characteristics of the gain to be applied to a compensation signal by the 3rd-order distortion generation path.
Figure 6B:
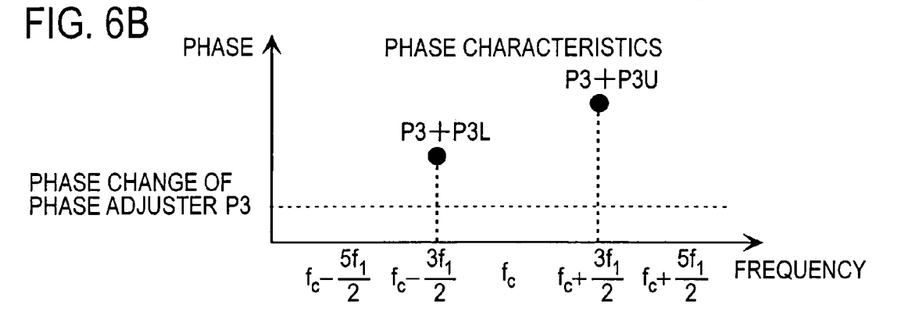
FIG. 6B illustrates a general idea of the frequency characteristics of the phase to be applied to a compensation signal by the 3rd-order distortion generation path.
Figure 6C:
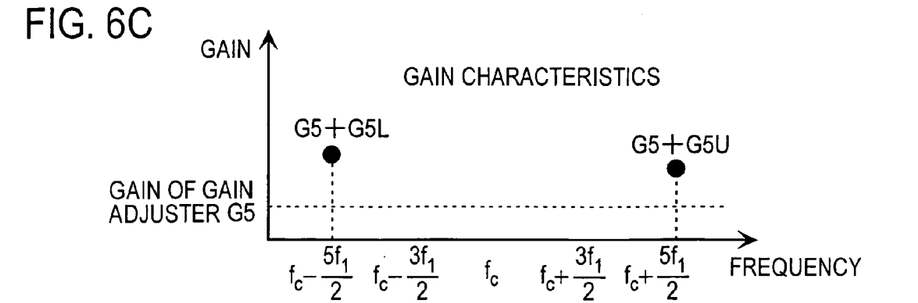
FIG. 6C illustrates a general idea of the frequency characteristics of the gain to be applied to a compensation signal by the 5th-order distortion generation path.
Figure 6D:
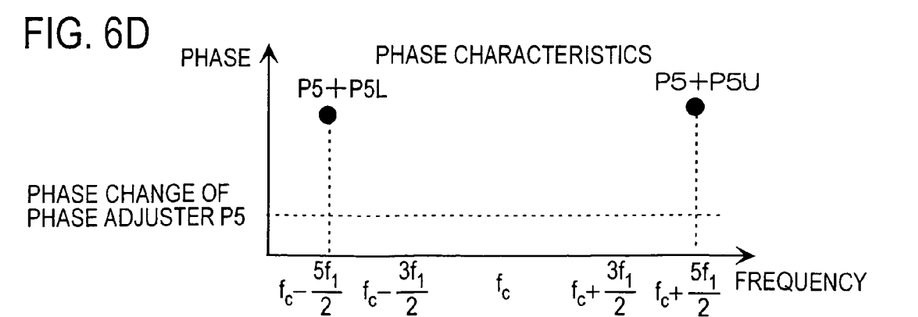
FIG. 6D illustrates a general idea of the frequency characteristics of the phase to be applied to a compensation signal by the 5th-order distortion generation path.

The processes shown of FIGS. 4 and 5 are repeated until each of the 3rd- and 5th-order intermodulation distortions meets the condition that the adjacent-channel leakage power ratio is lower than a predetermined value. The frequency characteristics that are ultimately added to the distortion compensating signal in the distortion generation path $DP_1$ are a combined version of the frequency characteristics by the gain adjuster $26_1$, the phase adjuster $25_1$ and the frequency characteristic compensator $24_1$, which are shown, for instance, as frequency characteristics of the gain and phase in FIGS. 6A and 6B. Similarly, the frequency characteristics that are ultimately added to the distortion compensating signal in the distortion generation path $DP_2$ are a combined version of the frequency characteristics by the gain adjuster $26_2$, the phase adjuster $25_2$ and the frequency characteristic compensator $24_2$, which are shown, for instance, as frequency characteristics of the gain and phase in FIGS. 6C and 6D.

The above description has been given of the method of compensation for only 3rd- and 5th-order distortions, but if necessary, the method is applicable to the compensation for 7th- and higher-order distortions. The 3rd- and 5th-order distortions have been described to be individually compensated, but they may be compensated at the same time.

The above-described method makes it possible to obtain frequency characteristics for the 3rd- and 5th-order distortion compensating signals, and permits compensation for the 3rd- and 5th-order distortions.

Embodiment 2

Figure 7:
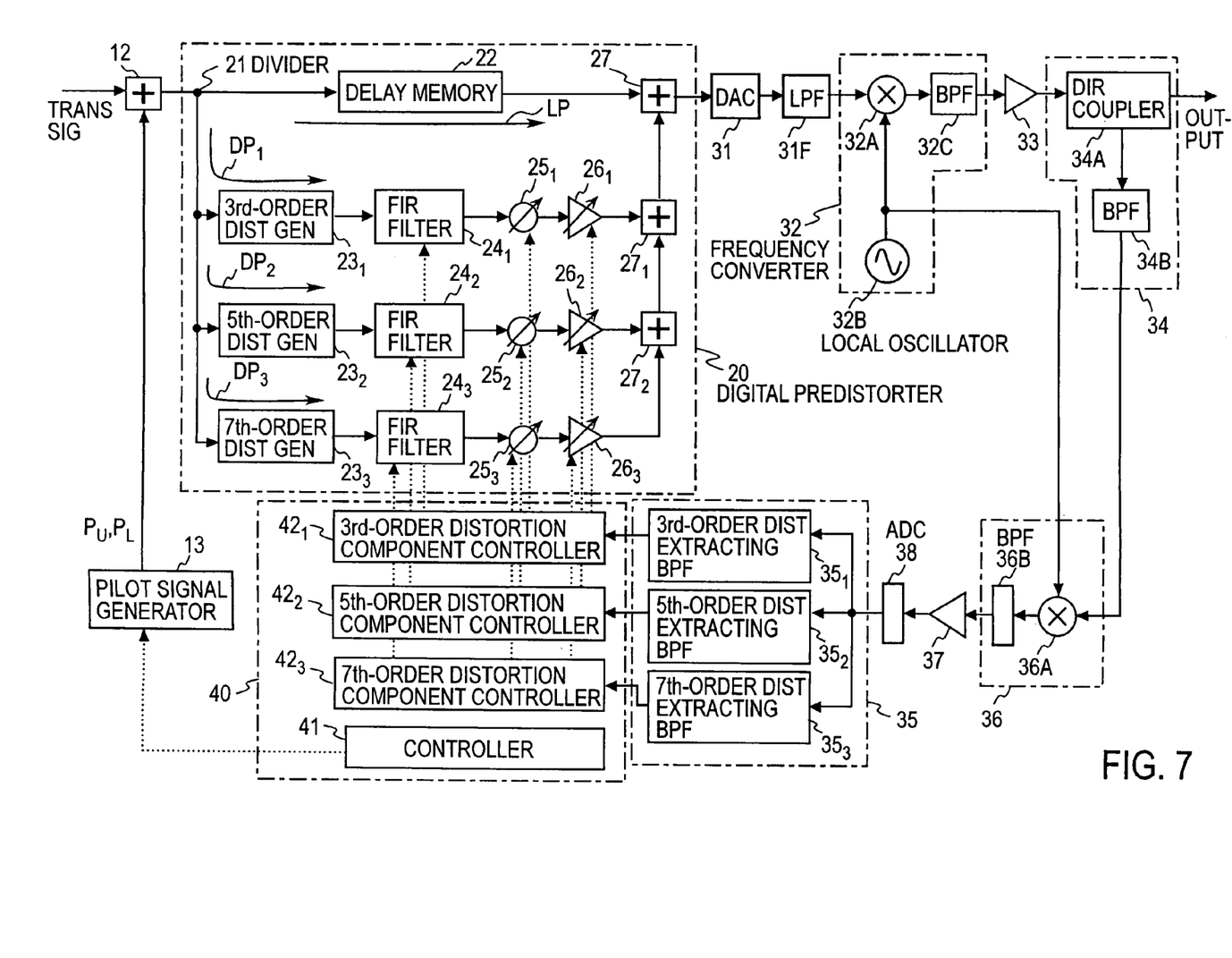
FIG. 7 is a block diagram illustrating a power series predistortion linearizer with a control means according to a second embodiment of the present invention.

FIG. 7 illustrates in block form a second embodiment of the present invention.

In this embodiment, a 7th-order distortion generation path $DP_3$ is added as another distortion generation path of the digital predistortion linearizer 20 in the FIG. 1 embodiment and the frequency characteristic compensator in each distortion generation path is formed by an FIR filter. The outputs from the respective distortion generation paths $DP_1$, $DP_2$ and $DP_3$ are added together by adders $27_1$ and $27_2$, and the added output is added by the adder 27 to the output from the linear signal transfer path LP via the delay memory 22.

There are further provided a low-pass filter 31F for removing aliasing from the DAC 31 output and a band pass filter 32C for removing an out-band signal from the output of the mixer 32A forming the frequency converter 32. The divider 34 is made up of a directional coupler 34A and a band pass filter 34B. The output from the divider 34 is down converted by a carrier of the frequency $f_c$ from the local oscillator 32B in a mixer 36A forming a frequency converter 36, and the down-converted signal is applied to a band pass filter 36B to provide, for example, a base band signal. The base band signal is amplified by an amplifier 37, and the amplified signal is converted by an analog-to-digital converter (ADC) 38 to a digital signal, which is provided to the distortion extractor 35.

The distortion extractor 35 is comprised of a 3rd-order distortion extracting band pass filter $35_1$, a 5th-order distortion extracting band pass filter $35_2$, and a 7th-order distortion extracting band pass filter $35_3$. The controller 40 is comprised of a 3rd-distortion component controller $42_1$, a 5th-order distortion component controller $42_2$, and a 7th-order distortion component controller $42_3$ that supplied with extracted 3rd-, 5th- and 7th-order distortion components to control the frequency characteristic compensators $24_1$, $24_2$, $24_3$, the phase adjusters $25_1$, $25_2$, $25_3$, and the gain adjusters $26_1$, $26_2$, $26_3$ corresponding to the respective orders. These distortion component controllers each have the ratio calculation part, the comparison part and the control part as is the case with the FIG. 1 embodiment, but they are not shown. The controller 40 is further provided with a control part 41 for controlling operations of the distortion component controllers $42_1$, $42_2$ and $42_3$.

The digital predistortion linearizer is shown to have the configuration for dealing with the 3rd-, 5th- and 7th-order distortions, but the number of orders may be changed as desired.

Figure 8:
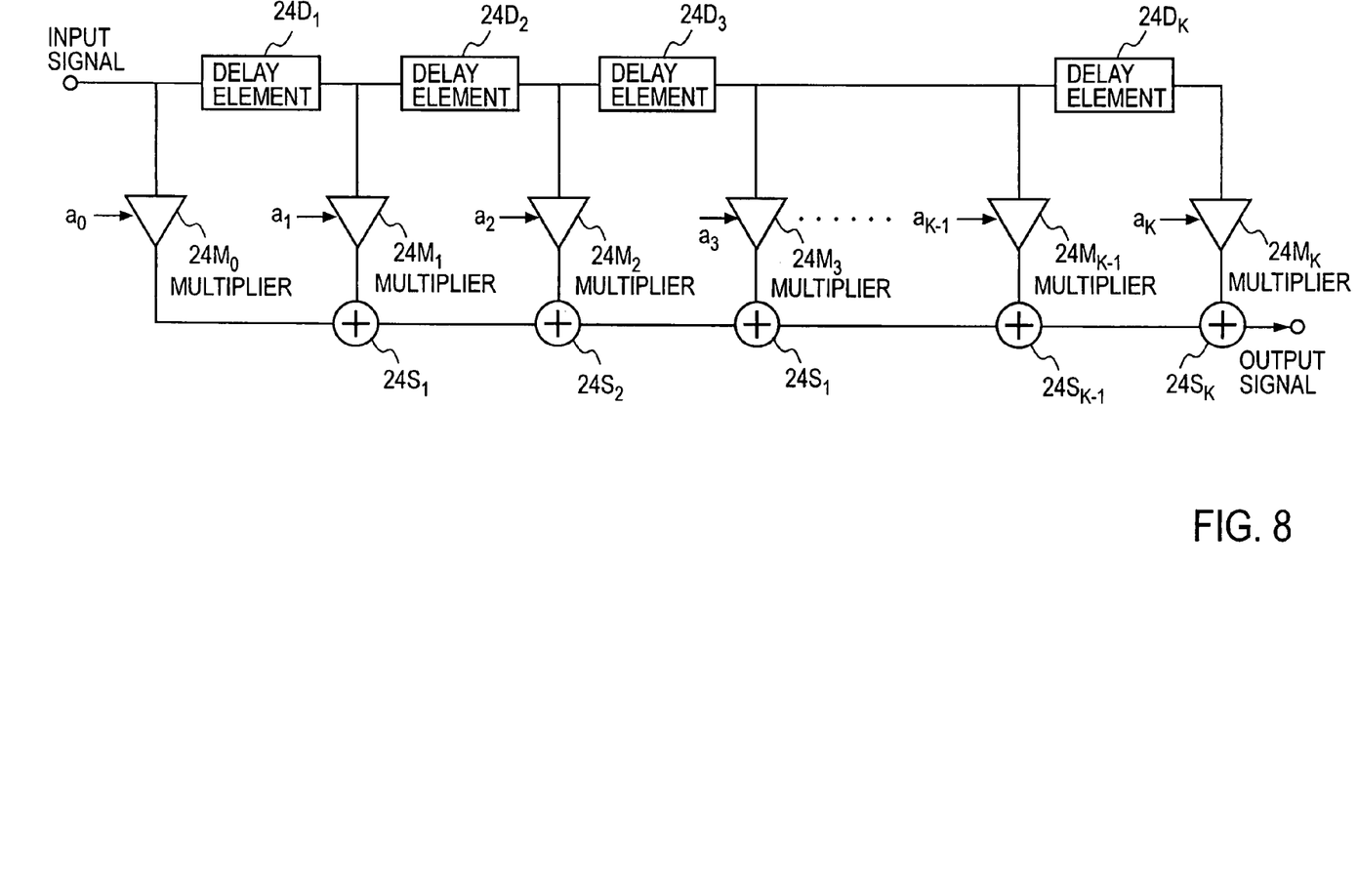
FIG. 8 is a block diagram showing an example of an FIR filter for use in the present invention.

The FIR filter forming each of the frequency characteristic compensators $24_1$, $24_2$ and $24_3$ comprises, as shown in FIG. 8, K cascade-connected delay elements $24D_1$ to $24D_K$, multipliers $24M_0$ to $24M_K$ for multiplying signals at input and output ends of the delay elements by preset tap coefficients $a_0$ to $a_K$, respectively, and adders $24S_1$ to $24S_K$ for adding the outputs from the multipliers. The values of the tap coefficients $a_0$ to $a_K$ can be determined so that the FIR filters $24_1$, $24_2$ and $24_3$ may have desired frequency characteristics.

The pilot signals $P_U$ and $P_L$, which are two carriers of the frequency interval $f_1$ and of the same amplitude, are input to the digital predistortion linearizer 20. The output signal from the digital predistortion linearizer 20 is a signal having added compensation signals to the pilot signals $P_U$ and $P_L$. The output signal is converted to an analog signal, which is up converted so that the center frequency becomes $f_c$, thereafter being input to the power amplifier 33. In this case, the compensation signal generated by the digital predistortion linearizer 20 is so set as to implement distortion compensation throughout the transmission route. Accordingly, the compensation signal in the input signal to the power amplifier 33 may differ from the compensation signal in the output signal from the digital predistortion linearizer 20.

The intermodulation distortion is extracted by the divider 34 formed by the directional coupler 34A and the band pass filter 34B, and the extracted distortion is down converted by the frequency converter composed of the mixer 36A and the band pass filter 36B. The down converted signal is converted by the analog-to-digital converter (ADC) 38 to a digital signal, which is input to the distortion extractor 35. The 3rd-, 5th- and 7th-order distortion component extracting band pass filters $35_1$, $35_2$ and $35_3$ forming the distortion extractor 35 extract upper and lower intermodulation distortion signals of the respective orders by upper and lower band pass filters (distortion component extracting BPFs), respectively. The 3rd-, 5th- and 7th-order distortion component controllers $42_1$, $42_2$ and $42_3$ each use the extracted signal to vary the amplitude and phase of the output from distortion generator 23 by the gain adjuster 26, the phase adjuster 25 and the frequency characteristic compensator 24 until the amount of compensation for distortion is reached at which the adjacent-channel leakage power ratio goes down below a predetermined value. The method for obtaining such amount of distortion compensation is the same as described previously. The frequency characteristics thus obtained are set as tap coefficients of the FIR filters $24_1$, $24_2$ and $24_3$ (frequency characteristic compensators). The FIR filters $24_1$, $24_2$ and $24_3$ may be disposed at the input sides of the odd-order distortion generators 23.

Embodiment 3

Figure 9:
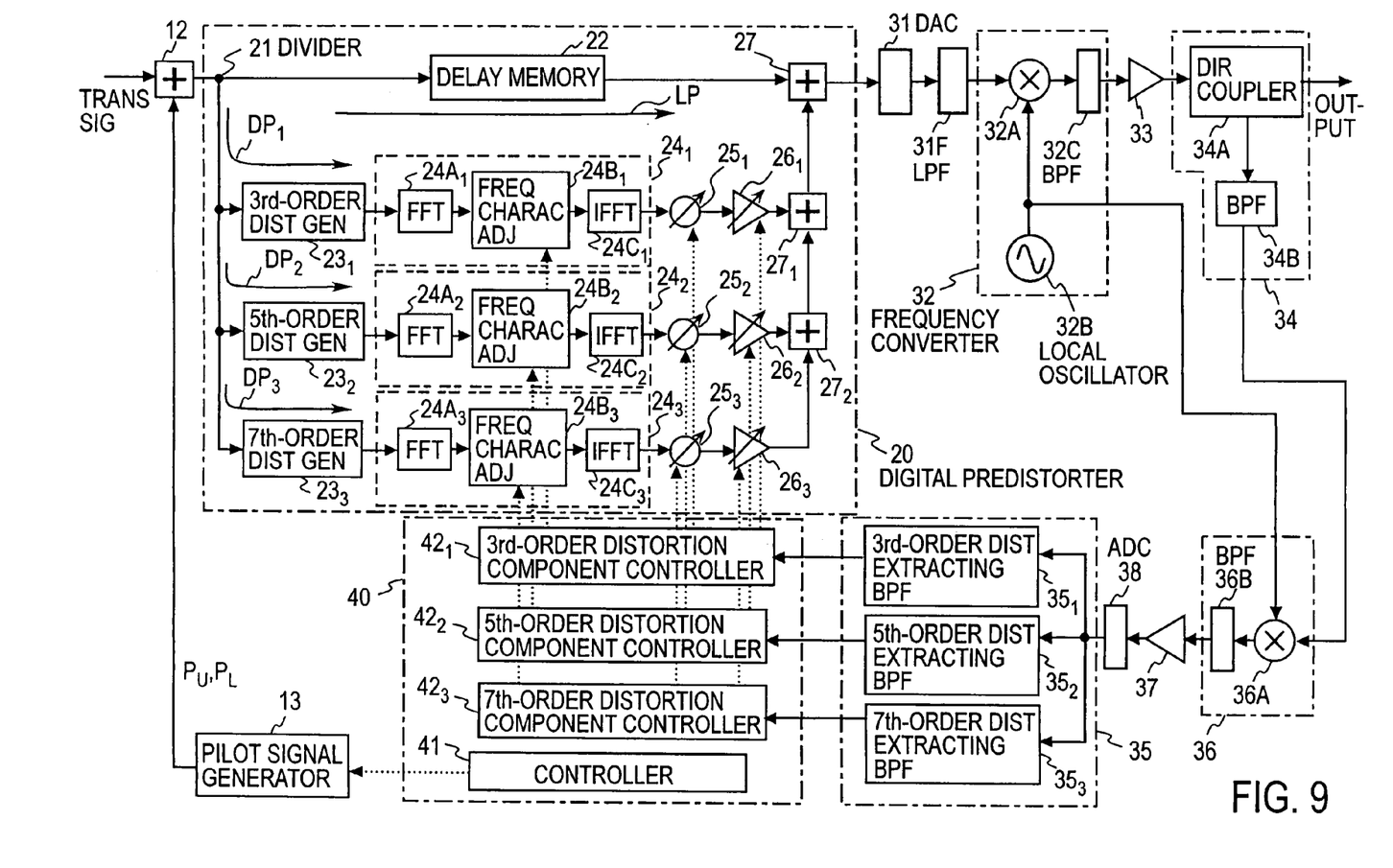
FIG. 9 is a block diagram illustrating a power series predistortion linearizer with a control means according to a third embodiment of the present invention.

FIG. 9 illustrates in block form a third embodiment of the present invention. In this embodiment, denoting the frequency characteristic compensator in (2n+1)th-order distortion generation path by $24_n$, where n=1, 2 and 3, the FIR filter forming the frequency characteristic compensator $24_n$ of the distortion generation path $DP_n$ of respective (2n+1) th-order in the FIG. 7 embodiment is replaced by a set of Fast Fourier Transform (FFT) $24A_n$, frequency characteristic adjuster $24B_n$ and Inverse Fast Fourier Transform (IFFT) $24C_n$. With this configuration for frequency characteristic control, the output signal from the distortion generator $23_n$ is converted by FFT $24A_n$ to a frequency-domain signal, then the signal is multiplied by the frequency characteristic adjuster $24B_n$ by coefficients of desired frequency characteristics, and the multiplied signal is inversely converted by IFFT $24C_n$ to a time-domain signal.

The 3rd-order distortion component controller $42_1$ of the controller 40 controls the gain adjuster $26_1$, the phase adjuster $25_1$ and multiplication coefficients of a frequency characteristic adjuster $24B_1$ of the 3rd-order distortion generation path $DP_1$ so that the 3rd-order distortion component in the output from the power amplifier 33 satisfies the condition that the adjacent-channel leakage power ratio is lower than a predetermined value. The same method as in the first embodiment is used to set the coefficients of the frequency characteristic adjuster $24B_1$ by use of the pilot signal. The same applies to the 5th- and 7th-order distortion generation paths $DP_2$ and $DP_3$. The FFT and the IFFT may be disposed at the input side of each odd-order distortion generator 23. The gain adjusters, the phase adjusters and the frequency characteristic adjusters of the 3rd-, 5th- and 7th-order distortion generation paths $DP_1$, $DP_2$ and $DP_3$ are controlled in the same manner as in the first embodiment.

Figure 10:
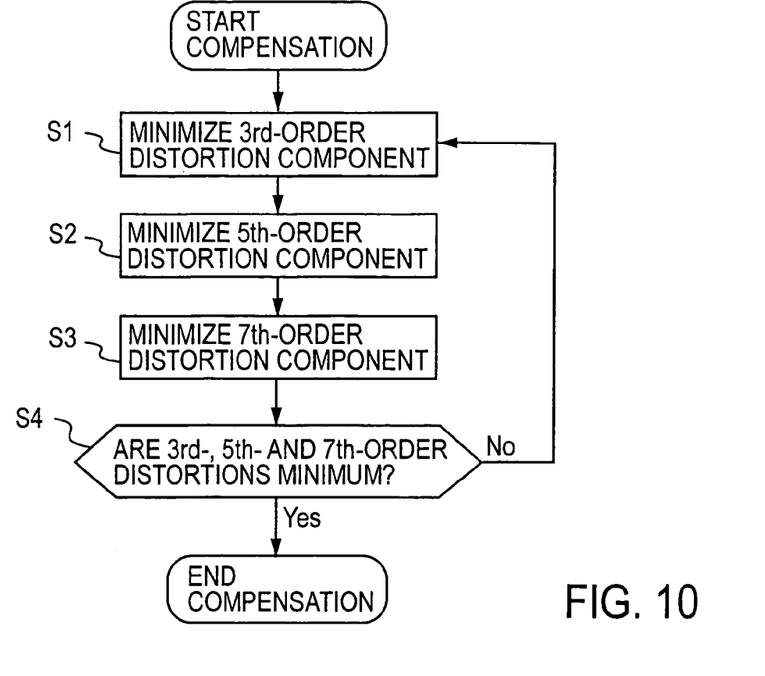
FIG. 10 is a flowchart showing the procedure for independent control of distortion components of multiple orders.

In the embodiments described above, the 3rd-, 5th- and 7th-order distortion generation paths $DP_1$, $DP_2$ and $DP_3$ of the digital predistortion linearizer 20 may be controlled independently of one another as depicted in FIG. 10. For example, in step S1 the gain adjuster $26_1$, the phase adjuster $25_1$ and the frequency characteristic compensator $24_1$ of the 3rd-order distortion generation path $DP_1$ are controlled in the same manner as in the first embodiment. That is, the control is effected so that the 3rd-order distortion component of the pilot signal being monitored is minimized in the output from the power amplifier 33. Upon completion of this control operation, control of the 3rd-order distortion generation path $DP_1$ is stopped, and in step S2 the gain adjuster $26_2$, the phase adjuster $25_2$ and the frequency characteristic compensator $24_2$ of the 5th-order distortion generation path $DP_2$ are similarly controlled so that the 5th-order distortion component of the pilot signal being monitored is minimized in the output from the power amplifier 33. In step S3 the gain adjuster $26_3$, the phase adjuster $25_3$ and the frequency characteristic compensator $24_3$ of the 7th-order distortion generation path $DP_3$ are similarly controlled so that the 7th-order distortion component of the pilot signal being monitored is minimized in the output from the power amplifier 33. In this way, the 3rd-, 5th- and 7th-order distortion generation paths are independently controlled. The above control is repeated until the 3rd-, 5th- and 7th-order distortion components are minimized.

In the second embodiment the control target value has been described to be the minimum value, but the control may be effected so that the target value is smaller than a reference value as described previously. The reference value may be changed, as appropriate, according to design conditions of the power amplifier, such as the adjacent-channel leakage power ratio and so one, and radio wave environments. Different reference values can be used for the 3rd-, 5th- and 7th-order distortion generation paths. The reference value can be changed in the course of control operation. For example, in the first control of the 3rd-order distortion generation path $DP_1$ a certain reference value is used until the target value becomes smaller than the reference value. In the case of controlling again the 3rd-order distortion generation path $DP_1$ after completion of the control of the 5th- and 7th-order distortion generation paths $DP_2$ and $DP_3$, the reference value may be changed a smaller one. The same goes for the distortion generation paths of other orders.

Figure 11:
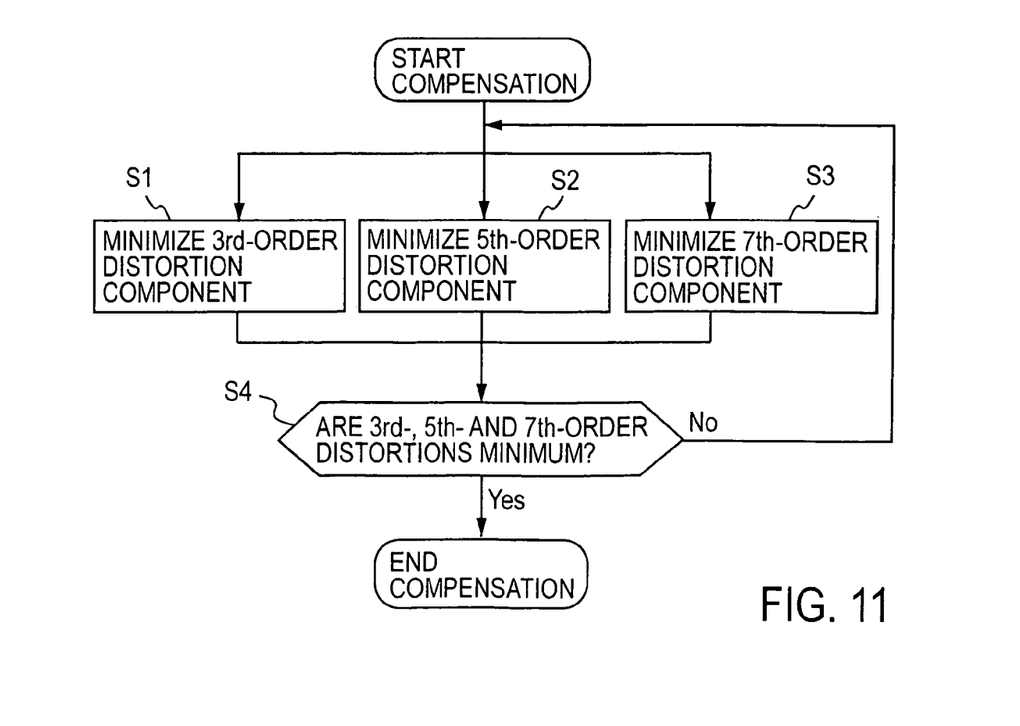
FIG. 11 is a flowchart showing the procedure for simultaneous control of distortions of multiple orders.

The control operations of the 3rd-, 5th- and 7th-order distortion generation paths $DP_1$, $DP_2$ and $DP_3$ of the digital predistortion linearizer 20 by steps S1, S2 and S3 in FIG. 10 may be carried out at the same time as shown in FIG. 11.

For example, the gain adjusters, the phase adjusters and the frequency characteristic compensators of the 3rd-, 5th- and 7th-order distortion generation paths $DP_1$, $DP_2$ and $DP_3$ are controlled repeatedly until the 3rd-, 5th- and 7th-order distortion components of the pilot signals being monitored are simultaneously minimized in the output from the power amplifier 33 in step S4 as is the case with the first embodiment. Alternatively, the control may be effected until the 3rd-, 5th- and 7th-order distortion components become smaller than reference values, respectively.

EFFECT OF THE INVENTION

According to the present invention, odd-order distortion components of pilot signals of upper and lower frequencies are individually controlled by the frequency characteristic compensators disposed in the respective odd-order distortion generation paths, by which it is possible to implement distortion compensation with high accuracy. Furthermore, since the predistortion linearizer is configured by digital signal processing technology, the predistortion linearizer configuration can be simplified as compared with those formed by analog elements as set forth in patent documents 2 and 3.

What is claimed is:

1. A control method for a power series predistortion linearizer wherein an input signal is divided and provided to a linear signal transfer path and N odd-order distortion generation paths, N being an integer equal to or greater than 1, and the outputs from said odd-order distortion generation paths are combined into a distortion compensation signal for compensating an intermodulation distortion by a power amplifier, and said odd-order distortion generation paths each have inserted therein a distortion generator for generating an odd-order distortion of said input signal and a frequency characteristic compensator for providing said odd-order distortion with desired frequency characteristics, said method comprising the steps of:

(a) inputting a pilot signal and said input signal to said power series predistortion linearizer;

(b) extracting distortion components of said pilot signal from the output from said power amplifier;

(c) comparing the upper-frequency one of said extracted distortion components of said pilot signal with a reference value, and adjusting frequency characteristics of the gain and phase of said frequency characteristic compensator so that said upper-frequency distortion component of said pilot signal becomes smaller than said reference value; and (d) comparing the lower-frequency one of said extracted distortion components of said pilot signal with said reference value, and adjusting frequency characteristics of the gain and phase of said frequency characteristic compensator so that said lower-frequency distortion component of said pilot signal becomes smaller than said reference value.

2. The method of claim 1, wherein said pilot signals is a two-carrier signal of the same amplitude but of different frequencies.

3. The method of claim 2, further comprising a step of repeating said steps (c) and (d) alternately twice or more times.

4. The method of claim 2, wherein said N is an integer equal to or greater than 2, and said adjustments by said steps (c) and (d) are performed for said distortion generation paths of different odd order on the basis of extracted different odd-order distortion components corresponding to said odd-order distortion generation paths, respectively.

5. The method of claim 4, wherein said adjustments for each of said N distortion generation paths are repeatedly performed until every odd-order distortion component becomes smaller than said reference value.

6. The method of claim 5, wherein the adjustments for said N distortion generation paths are performed in a sequential order in every round of repetition.

7. The method of claim 5, wherein the adjustments for said N distortion generation paths are performed at the same time in every round of repetition.

8. The method of claim 4 or 5, wherein said reference value is changed to a smaller value for each round of repetition.

9. The method of any one of claims 2, 3 and 4, wherein said each distortion generation path has further inserted therein a phase adjuster and a gain adjuster, which further comprises, prior to said steps (c) and (d), a step of controlling said phase adjuster and said gain adjuster so that the power of said distortion component extracted by said step (b) becomes smaller than a predetermined value.

10. A control apparatus for implementing said control method of claim 1, said apparatus comprising:

a pilot signal generator for generating and inputting a pilot signal to said power series predistortion linearizer;

a distortion extractor for extracting odd-order distortion components of said pilot signal from the output from said power amplifier; and a controller for controlling frequency characteristics of the gain and phase of said frequency characteristic compensator so that upper- and lower-frequency ones of said extracted odd-order distortion components of said pilot signal become smaller than said reference value.

11. The apparatus of claim 10, wherein said pilot signal is a two-carrier signal of the same amplitude but of different frequencies.

12. The apparatus of claim 11, wherein said N is an integer equal to or greater than 2, and said controller adjusts said frequency characteristic compensators of said distortion generation paths of different odd order on the basis of extracted different odd-order distortion components corresponding to said odd-order distortion generation paths, respectively.

13. The apparatus of claim 12, wherein said controller repeatedly performs adjustment for each of said N distortion generation paths until every odd-order distortion component becomes smaller than said reference value.

14. The apparatus of claim 13, wherein said controller performs the adjustments for said N distortion generation paths in a sequential order in every round of repetition.

15. The apparatus of claim 13, wherein said controller performs the adjustments for said N distortion generation paths at the same time in every round of repetition.

16. The apparatus of claim 13 or 14, wherein said controller changes said reference value to a smaller value for each round of repetition.

17. The apparatus of claim 12, wherein said frequency characteristic compensator in each odd-order distortion generation path is an FIR filter, and said controller controls tap coefficients of said FIR filter.

18. The apparatus of claim 12, wherein said frequency characteristic compensator is formed by a Fast Fourier Transform for transforming a signal to a frequency-domain signal, a frequency characteristic adjuster for adjusting the gain and phase of said frequency-domain signal, and an Inverse Fast Fourier Transform for inverse transforming said frequency-domain signal to a time-domain signal, and said controller controls the gain and phase of said frequency characteristic adjuster.

19. The apparatus of claim 11 or 12, wherein said each distortion generation path has further inserted therein a phase adjuster and a gain adjuster, and said controller controls said phase adjuster and said gain adjuster so that the power of said extracted distortion component becomes smaller than a predetermined value.

* * * * *